(12) United States Patent
Yasaka et al.

(10) Patent No.: US 9,129,771 B2
(45) Date of Patent: Sep. 8, 2015

(54) EMITTER STRUCTURE, GAS ION SOURCE AND FOCUSED ION BEAM SYSTEM

(71) Applicant: HITACHI HIGH-TECH SCIENCE CORPORATION, Minato-ku, Tokyo (JP)

(72) Inventors: Anto Yasaka, Tokyo (JP); Yasuhiko Sugiyama, Tokyo (JP); Hiroshi Oba, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/224,149

(22) Filed: Mar. 25, 2014

(65) Prior Publication Data
US 2014/0291542 A1   Oct. 2, 2014

(30) Foreign Application Priority Data
Mar. 26, 2013  (JP) .................................. 2013-063707

(51) Int. Cl.
G21K 5/04      (2006.01)
H01J 27/26     (2006.01)
H01J 37/08     (2006.01)
H01J 1/15      (2006.01)
H01J 1/18      (2006.01)
H01J 3/04      (2006.01)

(52) U.S. Cl.
CPC .  *H01J 27/26* (2013.01); *H01J 1/15* (2013.01); *H01J 1/18* (2013.01); *H01J 3/04* (2013.01); *H01J 37/08* (2013.01); *H01J 2237/06316* (2013.01)

(58) Field of Classification Search
USPC ............... 250/423 R, 424, 425, 423 P, 423 F; 315/111.01, 111.81, 111.91
See application file for complete search history.

(56) References Cited

U.S. PATENT DOCUMENTS

2007/0051900 A1    3/2007  Ward ............................. 250/423
2012/0126684 A1*   5/2012  Kaga et al. .................. 313/361.1
2012/0217391 A1*   8/2012  Shichi et al. .................. 250/306

* cited by examiner

*Primary Examiner* — Nicole Ippolito
(74) *Attorney, Agent, or Firm* — Adams & Wilks

(57) ABSTRACT

There is provided an emitter structure, a gas ion source including the emitter structure, and a focused ion beam system including the gas ion source. The emitter structure includes a pair of conductive pins which are fixed to a base member, a filament which is connected between the pair of conductive pins, and an emitter which is connected to the filament and has a sharp tip. A supporting member is fixed to the base material, and the emitter is connected to the supporting member.

19 Claims, 5 Drawing Sheets

EMITTER STRUCTURE, GAS ION SOURCE AND FOCUSED ION BEAM SYSTEM

CROSS-REFERENCE TO RELATED APPLICATION

This application claims priority from Japanese Patent Application No. 2013-063707, filed on Mar. 26, 2013, the entire subject matter of which is incorporated herein by reference.

TECHNICAL FIELD

The present invention relates to an emitter structure, a gas ion source and a focused ion beam system.

BACKGROUND

There has been known a focused ion beam system as a system for performing observation, various evaluation or analysis, or the like on a sample such as a semiconductor device, and for preparing a TEM sample by taking a fine and thin sample fragment from a sample and fixing the thin sample fragment to a sample holder.

This focused ion beam system includes an ion source for generating ions, and radiates ions generated in the ion source as a focused ion beam.

There are many types of ion sources. For example, a plasma type ion source and a liquid-metal ion source have been known. Recently, there have been provided a gas field ion source (GFIS) capable of generating focused ion beams having a smaller beam diameter and higher luminance as compared to the above-described ion sources.

The gas field ion source mainly includes an emitter structure having an aciculate emitter with a tip which is sharpened at an atomic level, a gas source for supplying a gas such as helium (He) to the vicinity of the emitter, a cooling unit for cooling the emitter, and an extraction electrode disposed at a position apart from the tip of the emitter.

Here, an emitter structure disclosed in JP-A-2012-098293 will be described briefly.

As shown in FIG. 8, an emitter structure 100 mainly includes a base member 101, a pair of conductive pins 102 fixed to the base member 101, a filament 103 connected between the tips of the conductive pins 102, and the emitter 104 connected to the filament 103.

The emitter 104 is hung and held on the filament 103 in a state where a base end portion of the emitter 104 is connected to the filament 103 by spot welding or the like.

In this configuration, after the gas is supplied to the vicinity of the emitter 104, if an extraction voltage is applied between the emitter 104 and an extraction electrode (not shown) while the emitter 104 is cooled, the gas is ionized into gas ions by a high electric field formed around a tip portion of the emitter 104. Then, the gas ions are drawn toward the extraction electrode repulsively from the emitter 104 having a positive potential. Thereafter, the drawn gas ions are focused while being appropriately accelerated, thereby becoming a focused ion beam.

Especially, since the focused ion beam generated from the gas field ion source has a small beam diameter and narrow energy spread (radiation angle distribution), it is possible to irradiate a sample with the beam having a small beam diameter. Therefore, it becomes possible to improve the resolution during observation or perform finer etching.

Meanwhile, when a crystal structure of the emitter 104 is broken, by supplying electric power from a current source (not shown) to the emitter 104 through the conductive pins 102 and the filament 103 to heat the emitter 104, atoms configuring the emitter 104 are rearranged.

As described above, in the emitter structure 100, since the emitter 104 is held only by the filament 103, transfer of heat to the emitter 104 is performed mainly through the filament 103. In this case, during heating of the emitter 104, or during rearranging of the emitter 104, since the amount of heat radiation from the emitter 104 is small, the emitter 104 is efficiently heated through the filament 103. However, there is a problem in that cooling efficiency is low during cooling of the emitter 104, such as during generating of gas ions.

The ion emission amount of the gas field ion source depends highly on temperature. Thus, it is preferable to operate the gas field ion source at lower temperature.

Also, in the emitter structure 100, since the emitter 104 is held only by the filament 103 as described above, it is difficult to hold the emitter 104 perpendicularly with respect to the base member 101. Since a focused ion beam which is generated from the gas field ion source has a narrow radiation angle distribution as described above, in order to surely radiate the focused ion beam toward a sample, the optical axis of the focused ion beam is required to be aligned with a desired direction.

With respect to this, JP-A-2012-098293 discloses a configuration provided with a gimbal mechanism (tip manipulator) for adjusting the tilt or position of the optical axis of a focused ion beam generated from the emitter 104.

However, the provision of the gimbal mechanism causes problems such as an increase in the number of components, and complication of the system.

SUMMARY

The present invention has been made in view of the above-described circumstances, and an object of the present invention is to provide an emitter structure, a gas ion source and a focused ion beam system which are capable of improving the cooling efficiency of an emitter, reducing the number of components, simplifying the system, and accurately and stably holding the emitter with respect to a base member.

According to an illustrative embodiment of the present invention, there is provided an emitter structure comprising: a pair of conductive pins which are fixed to a base member; a filament which is connected between the pair of conductive pins; and an emitter which is connected to the filament and has a sharp tip, wherein a supporting member is fixed to the base material, and the emitter is connected to the supporting member.

According to this configuration, since the emitter is connected not only to the filament but also to the supporting member, it is possible to more stably hold the emitter with respect to the base member, as compared to a configuration in which the emitter is hung and held only by the filament as in the related-art configuration. In this case, it becomes easy to vertically hold the emitter, and it is possible to make it easy to align the optical axis of the focused ion beam with a desired direction. Also, unlike in the related-art configuration, since it is unnecessary to separately provide a gimbal mechanism or the like for adjusting the tilt or position of the optical axis of the focused ion beam, it is possible to reduce the number of components, simplify the system, and more accurately and stably hold the emitter with respect to the base member.

Also, during cooling of the emitter, heat of the emitter is radiated to the base member and so on through the supporting member. Therefore, as compared to a case where heat of the emitter is radiated only through the filament as in the related-art configuration, it is possible to improve the cooling efficiency of the emitter.

In the above emitter structure, the supporting member may be formed of a material having thermal conductivity higher than that of the filament.

According to this configuration, since the supporting member is formed of a material having thermal conductivity higher than that of the filament, heat of the emitter is efficiently radiated to the supporting member. Therefore, it is possible to surely improve the cooling efficiency of the emitter.

In the above emitter structure, the supporting member may be formed thicker than the filament.

According to this configuration, since the supporting member is formed thicker than the filament, heat of the emitter is efficiently radiated to the supporting member. Therefore, it is possible to surely improve the cooling efficiency of the emitter.

In the above emitter structure, the supporting member may be formed in a cylindrical shape, and the emitter may be fixed while a base end portion of the emitter is inserted into the supporting member.

According to this configuration, since the emitter is inserted into the cylindrical supporting member, and is fixed in that state, it is possible to more stably hold the emitter.

According to another illustrative embodiment of the present invention, there is provided a gas ion source comprising: the above-described emitter structure; a gas source which is configured to supply a gas to a vicinity of the emitter; a cooling unit configured to cool the emitter; an extraction electrode which is disposed apart from the tip of the emitter; and an extraction power source unit which is configured to apply an extraction voltage between the emitter and the extraction electrode to ionize the gas into gas ions at the tip of the emitter and extract the gas ions toward the extraction electrode.

According to a further illustrative embodiment of the present invention, there is provided a focused ion beam system comprising: the above-described gas ion source; and a beam optical system which is configured to convert the extracted gas ions into a focused ion beam and irradiate a sample with the focused ion beam.

According to this configuration, since the emitter structure is provided, it is possible to stably generate gas ions, and it is possible to continuously radiate a focused ion beam with a small beam diameter and high luminance, in a desired direction.

According to this configuration, it is possible to improve the cooling efficiency of the emitter, reduce the number of components, simplify the system, accurately and stably hold the emitter with respect to the base member, and make it easy to align the optical axis of a focused ion beam with a desired direction.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Hereinafter, illustrative embodiments of the present invention will be described with reference to the accompanying drawings.

[Focused Ion Beam System]

Figure 1:
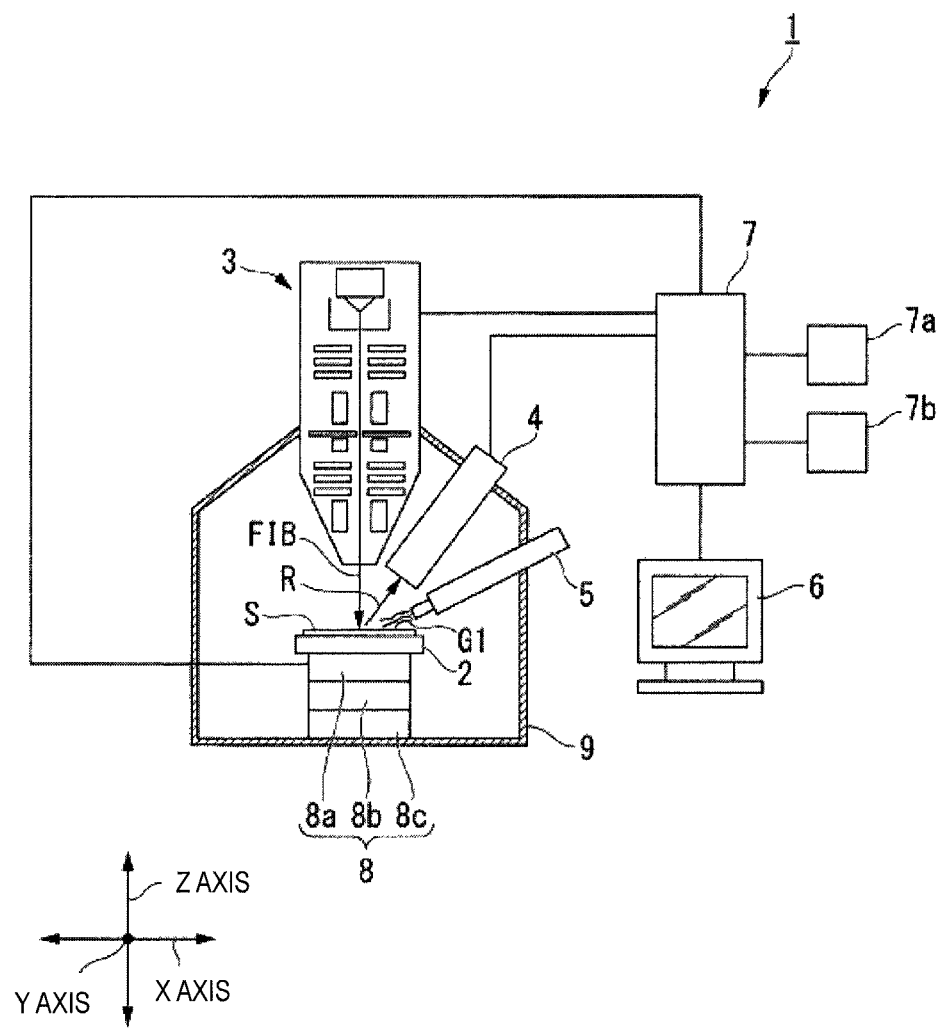
FIG. 1 is a view illustrating the overall configuration of a focused ion beam system according to a first illustrative embodiment of the present invention.

FIG. 1 is a view illustrating the overall configuration of a focused ion beam system 1.

As shown in FIG. 1, the focused ion beam system 1 of the present illustrative embodiment mainly includes a stage 2 on which a sample S is placed, a focused ion beam lens barrel 3 which radiates a focused ion beam (FIB), a detector 4 which detects secondary charged particles R generated by irradiation with the focused ion beam (FIB), a gas gun 5 which supplies a source gas G1 for forming a deposition film, and a control unit 7 which generates image data based on the detected secondary charged particles R and controls a display unit 6 to display the image data.

The stage 2 is configured to operate based on instructions of the control unit 7, and is supported by a displacing mechanism 8 capable of displace the stage 2 on five axes. Specifically, the displacing mechanism 8 includes a horizontal movement mechanism 8a which moves along an X axis and a Y axis which are parallel to a horizontal plane and are perpendicular to each other and along a Z axis which is perpendicular to the X axis and the Y axis, a tilt mechanism 8b which rotates the stage 2 around the X axis (or the Y axis), thereby tilting the stage 2, and a rotation mechanism 8c which rotates the stage 2 around the Z axis.

Therefore, it is possible to radiate the focused ion beam (FIB) toward a desired position using the displacing mechanism 8 to displace the stage 2 on the five axes. Meanwhile, the stage 2 and the displacing mechanism 8 are accommodated inside a vacuum chamber 9. Therefore, irradiation with the focused ion beam (FIB), supply of the source gas G1, and the like are performed inside the vacuum chamber 9.

<Focused Ion Beam Lens Barrel>

Figure 2:
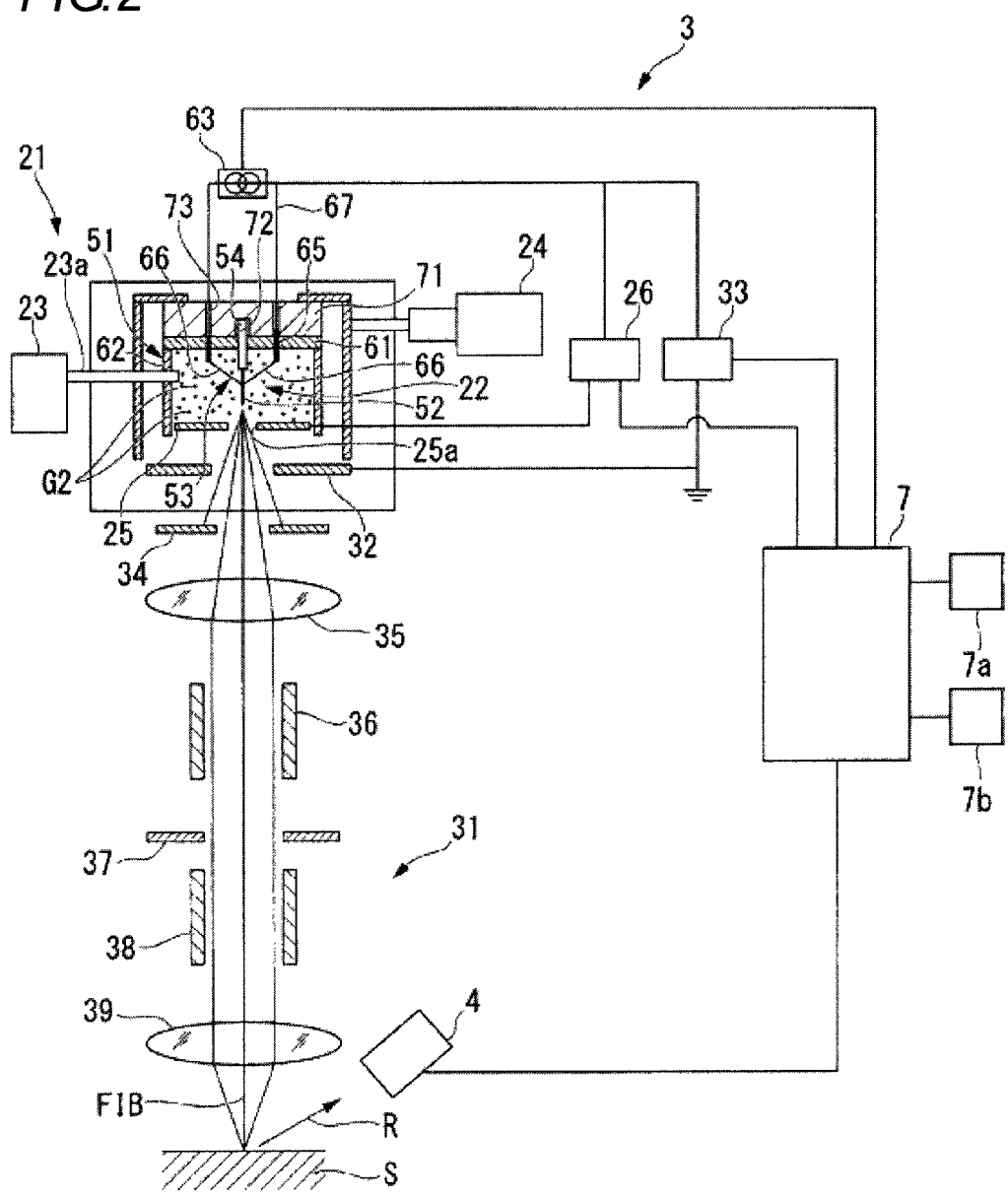
FIG. 2 is a view illustrating the configuration of a focused ion beam lens barrel included in the focused ion beam system.

FIG. 2 is a view illustrating the configuration of the focused ion beam lens barrel 3.

As shown in FIG. 2, the focused ion beam lens barrel 3 includes a gas field ion source (a gas ion source) 21 for generating gas ions G3 (see FIG. 7) from a gas G2, and a beam optical system 31 for converting the gas ions G3 into a focused ion beam (FIB), and radiating the focused ion beam onto the sample S.

The gas field ion source 21 of the focused ion beam lens barrel 3 mainly includes an emitter structure 22, a gas source 23, a cooling unit 24, an extraction electrode 25, and an extraction power source unit 26.

Figure 3:
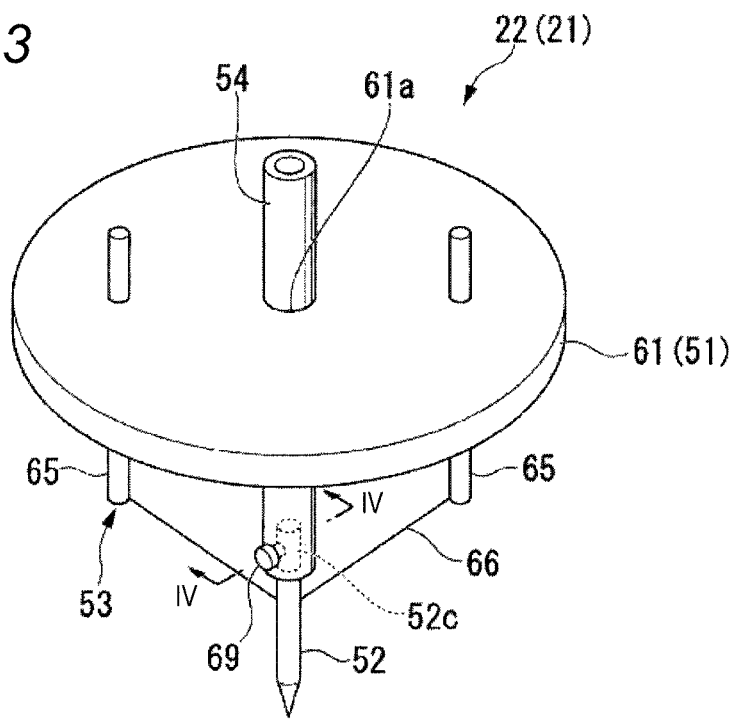
FIG. 3 is a perspective view of an emitter structure.

FIG. 3 is a perspective view of the emitter structure 22.

As shown in FIGS. 2 and 3, the emitter structure 22 includes an emitter 52 and a heating unit 53 which are accommodated in an ion generating chamber 51, and a supporting member 54 which supports the emitter 52.

The ion generating chamber 51 is formed of, for example, a ceramic material, in a box shape with an open bottom.

Specifically, the ion generating chamber 51 includes a base member 61 and a surrounding member 62 which extends downward from the peripheral edge of the base member 61 and surrounds the base member 61. The ion generating chamber 51 is configured to maintain the inside thereof in a high vacuum state.

The heating unit 53 performs a function of locally heating the tip of the emitter 52 to a predetermined temperature based on a current from a current source 63 which operates according to an instruction from the control unit 7, thereby rearranging atoms configuring the emitter 52. Specifically, the heating unit 53 includes a pair of conductive pins 65, and a filament 66 which is connected between the tips of the conductive pins 65.

Each conductive pin 65 is formed of a conductive material such as a metal in a solid rod shape, and is fixed to the base member 61 by soldering in a state where the conductive pin 65 is passing through the base member 61. Therefore, the upper end portions of the conductive pins 65 are positioned outside the ion generating chamber 51, and the lower end portions of the conductive pins 65 are positioned inside the ion generating chamber 51. From each conductive pin 65, a wiring line 67 is led out toward the current source 63.

The filament 66 is formed of a high-resistance material such as tungsten (W), and both end portions of the filament 66 are connected to the lower end portions of the conductive pins 65, respectively, by welding or the like. As shown in FIGS. 2 and 3, the filament 66 is held in a "V" shape which is inclined downward toward the central portion.

Figure 4:
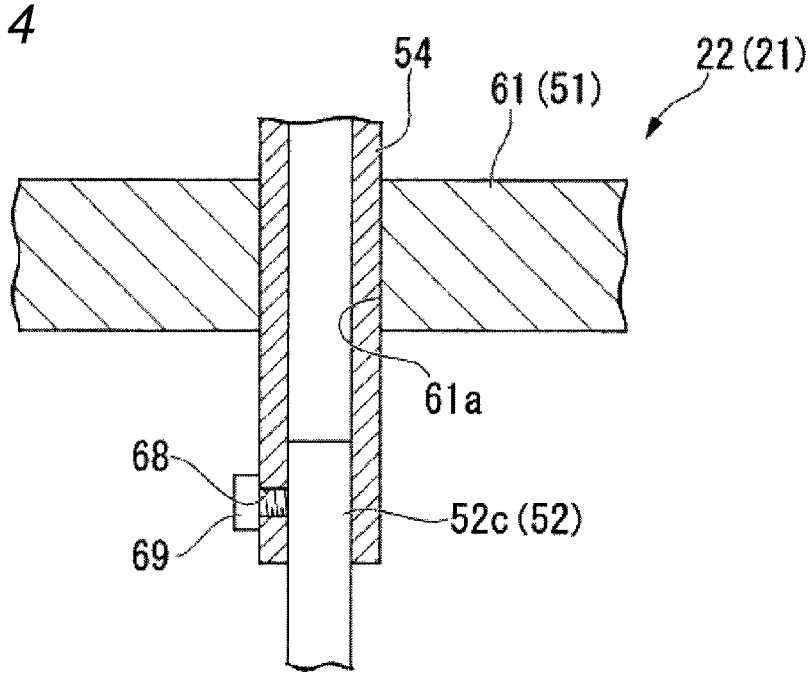
FIG. 4 is a cross-sectional view taken along a line IV-IV of FIG. 3.

FIG. 4 is a cross-sectional view taken along a line IV-IV of FIG. 3.

As shown in FIGS. 3 and 4, in the present illustrative embodiment, the supporting member 54 is formed of a material, such as copper, having thermal conductivity higher than that of the filament 66, and formed in a tubular shape, such as a cylindrical shape, having a diameter thicker than the filament 66 and the conductive pins 65. The supporting member 54 is inserted into a through-hole 61a formed at a portion of the base member 61 positioned between the conductive pins 65 as seen in a side view. In this state, the supporting member 54 is fixed to the base member 61 by soldering or the like. Therefore, the upper end portion of the supporting member 54 is positioned outside the ion generating chamber 51, and the lower end portion of the supporting member 54 is positioned inside the ion generating chamber 51.

Figure 5:
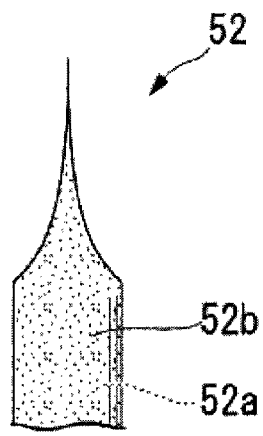
FIG. 5 is an enlarged view of a tip of an emitter.

FIG. 5 is an enlarged view of the tip of the emitter 52.

Figure 6:
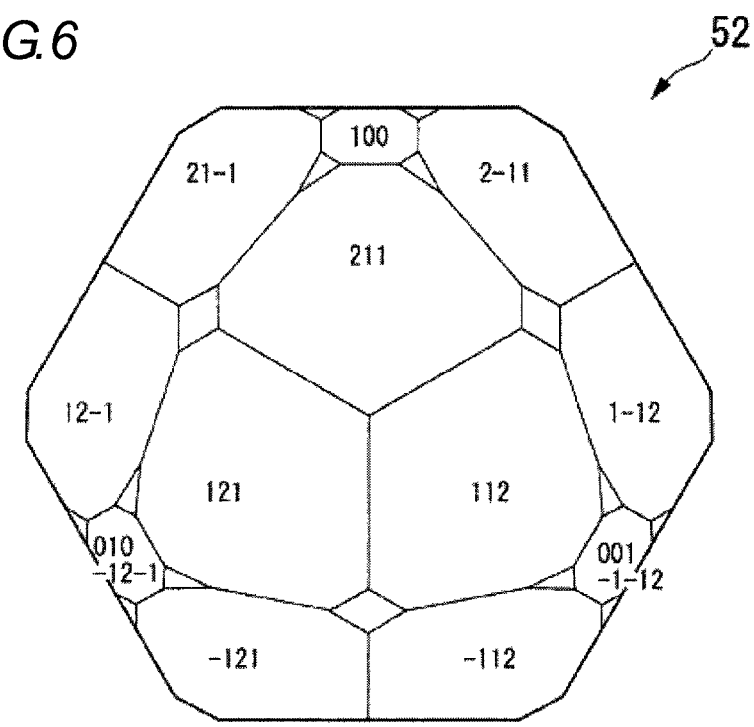
FIG. 6 is an enlarged view of the tip of the emitter at an atomic level.

The emitter 52 is an aciculate member having a sharp tip (lower end) as shown in FIG. 5, and is configured, for example, by coating a base material 52a made of tungsten (W) or the like with a noble metal 52b such as iridium (Ir). The tip of the emitter 50 is sharpened at an atomic level, and specifically, the tip is configured such that a crystal structure becomes a pyramidal shape as shown in FIG. 6. FIG. 6 is an enlarged view of the tip of the emitter 52 at an atomic level.

An upper portion of the emitter 52 is connected to the central portion (lower edge portion) of the filament 66 by spot welding or the like. Also, the upper end portion (insertion portion 52c) of the emitter 52 positioned higher than the connection portion with the filament 66 is inserted into the supporting member 54 from below.

Meanwhile, at a portion of the supporting member 54 overlapping the insertion portion 52c of the emitter 52 in a radial direction (a portion of the supporting member 54 into which the insertion portion 52c of the emitter 52 is inserted), a through-hole 68 is formed in the radial direction, and a locking screw 69 is screwed into the through-hole 68. The tip portion of the locking screw 69 passes through the supporting member 54 in the radial direction and comes into contact with the peripheral surface of the emitter 52 (the insertion portion 52c). Therefore, the emitter 52 is supported in the supporting member 54 in a state where the insertion portion 52c is interposed between the edge surface of the locking screw 69 and the inner circumferential surface of the supporting member 54.

The gas source 23 is for supplying a small amount of gas (for example, helium (He)) G2 to the vicinity of the emitter 52, and is connected to the ion generating chamber 51 through a gas introduction pipe 23a.

The extraction electrode 25 is provided to extend inward from the edge of the opening of the ion generating chamber 51 and be apart from the tip (lower end) of the emitter 52. Further, an opening 25a is formed at a position of the extraction electrode 25 facing the tip (lower end) of the emitter 52 in a vertical direction.

Figure 7:
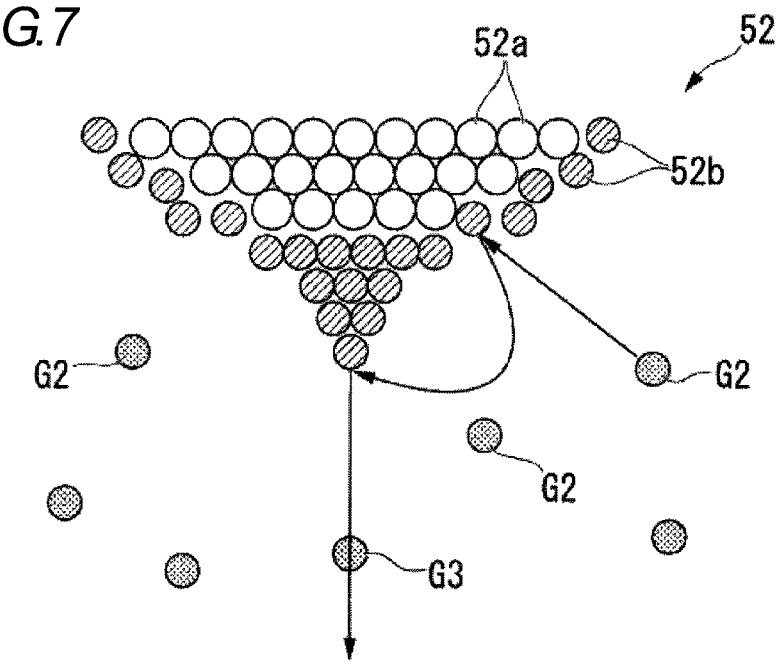
FIG. 7 is a view illustrating a state where gas ions are generated from the tip of the emitter.

The extraction power source unit 26 is a power source for applying an extraction voltage between the extraction electrode 25 and the emitter 52. The extraction power source unit 26 applies the extraction voltage, thereby ionizing the gas G2 into gas ions G3 at the tip of the emitter 52 as shown in FIG. 7, and then extracting the gas ions G3 toward the extraction electrode 25.

The cooling unit 24 is for cooling the emitter 52 by a coolant such as liquid helium or liquid nitrogen. Incidentally, the present invention is not limited thereto, the cooling unit can be configured in any other ways as long as it is possible to cool at least the emitter 52. For example, the cooling unit can be configured such that a cooling block, a refrigerator, or the like is used to perform cooling.

On the ion generating chamber 51, a cold head 71 for dissipating heat of the emitter 52 is provided. The cold head 71 is formed of a ceramic material such as alumina, sapphire, or aluminum nitride in a block shape, and is fixed to the upper surface of the base member 61. A portion of the cold head 71 facing the supporting member 54 is formed with an accommodating recess 72 for accommodating the upper end portion of the supporting member 54 (a protruding portion from the base member 61) is formed. Then, the supporting member 54 is accommodated in the housing recess 72 in a state where the peripheral surface of the supporting member 54 is close to or in contact with the inner circumferential surface of the housing recess 72.

Also, at portions of the cold head 71 facing the conductive pins 65, through-holes 73 are formed through the cold head 71 in the vertical direction, respectively. The upper end portions of the conductive pins 65 are inserted into the through-holes 73 from below, and are connected to the wiring lines 67 inside the through-holes 73.

<Beam Optical System>

As shown in FIG. 2, below the extraction electrode 25, a cathode 32 having a ground potential is provided. An acceleration voltage from an acceleration power source unit 33 is applied between the cathode 32 and the emitter 52, whereby energy is applied to the extracted gas ions G3. As a result, the gas ions are accelerated, thereby being converted into an ion beam. Below the cathode 32, a first aperture 34 for narrowing the ion beam is provided. Below the first aperture 34, a condenser lens 35 for focusing the ion beam, thereby converting the ion beam into a focused ion beam (FIB) is provided.

Below the condenser lens 35, an aligner 36 for adjusting the optical axis of the focused ion beam (FIB) is provided.

Also, below the aligner 36, a second aperture 37 for further narrowing the focused ion beam (FIB) is provided to be movable in X-axis and Y-axis directions. Below the second aperture 37, a polarizer 38 for radiating the focused ion beam (FIB) onto the sample S is provided. Below the polarizer 38, an objective lens 39 for focusing the focused ion beam (FIB) on the sample S is provided.

The cathode 32, the acceleration power source unit 33, the first aperture 34, the condenser lens 35, the aligner 36, the second aperture 37, the polarizer 38, and the objective lens 39 configure the beam optical system 31 for converting the extracted gas ions G3 into the focused ion beam (FIB) and then irradiating the sample S with the focused ion beam. Also, although not shown, an astigmatism corrector and a beam-position adjusting mechanism used in a related-art focused ion beam system are also included in the beam optical system 31.

The detector 4 detects secondary charged particles R such as secondary electrons, secondary ions, reflected ions, and scattered ions generated from the sample S during irradiation with the focused ion beam (FIB), and outputs the detection result to the control unit 7.

The gas gun 5 is configured to supply a compound gas containing a material (for example, phenanthrene, platinum, carbon, or tungsten) to be a raw material for a deposition film, as the source gas G1. The source gas G1 is decomposed and separated into a gas component and a solid component by the secondary charged particles R generated by irradiation with the focused ion beam (FIB). Then, the solid component of the separated two components is deposited, thereby becoming the deposition film.

Also, for the gas gun 5, a material (for example, xenon fluoride, chlorine, iodine, or water) for selectively accelerating etching can be used. For example, in a case where the sample S is Si-based, xenon fluoride can be used, and in a case where the sample S is organic-based, water can be used. Also, it is possible to advance etching on a specific material by supplying the compound gas at the same time as irradiation with the ion beam.

The control unit 7 is configured to generally control the individual components, and to be able to appropriately change the extraction voltage, the acceleration voltage, the beam current and the like. For this reason, it is possible to freely adjust the beam diameter of the focused ion beam (FIB). Therefore, it is possible not only to acquire an observation image but also to locally perform etching (rough processing, finish processing, or the like) on the sample S.

The control unit 7 converts the secondary charged particles R detected by the detector 4, into a luminance signal, thereby generating observation image data, and then controls the display unit 6 such that the display unit 6 outputs an observation image based on the observation image data. Therefore, it is possible to confirm the observation image through the display unit 6. The control unit 7 is connected to an input unit 7a which can be used for an operator to input, and controls the individual components based on a signal input by the input unit 7a. That is, the operator can use the input unit 7a to irradiate a desired area with the focused ion beam (FIB), thereby observing the desired area, or to perform etching on a desired area, or to irradiate a desired area with the focused ion beam (FIB) while supplying the source gas G1 to the desired area, thereby depositing a deposition film.

Subsequently, a case of using the focused ion beam system 1 will be described below.

First, initial setting in a case of radiating the focused ion beam (FIB) according to a sample S or a purpose is performed. That is, the extraction voltage, the acceleration voltage, a gas pressure at which the gas G2 will be supplied, a temperature, and the like are set to optimal values. Also, the position or inclination of the gas field ion source 21, the position of the second aperture 37, and the like are adjusted, whereby optical axis adjustment is performed.

After the initial setting ends, the gas G2 is supplied from the gas source 23 into the ion generating chamber 21 while the emitter 52 is cooled to a predetermined temperature, for example, about 20 K to 100 K, by the cooling unit 24.

In this case, heat of the emitter 52 is radiated to the cold head 71 mainly through the supporting member 54, and is also radiated to the cold head 71 through the supporting member 54 and the base member 61, and then is radiated to the outside through the cooling unit 24. At this time, the heat of the emitter 52 is also radiated to the cold head 71 through the heating unit 53 such as the filament 66 and the conductive pins 65. However, the amount of heat radiation through the supporting member 54 is larger than the amount of heat radiation through the heating unit 53. Therefore, the emitter 52 is efficiently cooled.

After supply of the gas G2 and cooling of the emitter 52 are sufficiently performed, the extraction voltage is applied between the extraction electrode 25 and the emitter 52 by the extraction power source unit 26. Then, the electric field of the tip of the emitter 50 becomes locally higher, and thus the gas G2 in the ion generating chamber 51 is ionized into gas ions G3 at the tip of the emitter 52 by the electric field as shown in FIG. 7. Then, the gas ions G3 are extracted toward the extraction electrode 25 repulsively from the emitter 52 which is maintained at a positive potential.

The extracted gas ions G3 are converted into the focused ion beam (FIB) by the beam optical system 31, and the focused ion beam (FIB) is radiated toward the sample S as shown in FIG. 2. In this way, observation on the sample S, etching, or the like can be performed. Also, in a case of radiating the focused ion beam (FIB), it is possible to supply the source gas G1 from the gas gun 5, thereby generating a deposition film. That is, the secondary electrons generated by irradiation with the focused ion beam (FIB) decompose the source gas G1 into a gas component and a solid component and separate the gas component and the solid component from each other. Then, of the separated two components, only the solid component is deposited on the sample S, thereby forming a deposition film.

As described above, besides observation or processing, generation of a deposition film is possible. Therefore, by appropriately using these features, it is possible to widely use the focused ion beam system 1 of the present illustrative embodiment as a microscope or an apparatus for performing length measurement, cross-section observation, cross-section length measurement, preparing of a TEM sample, mask repair, drawing, and the like.

Especially, since the focused ion beam (FIB) of the present illustrative embodiment is a beam generated from the gas field ion source 21, the focused ion beam (FIB) is a beam having a smaller beam diameter and higher luminance as compared to a plasma type ion source or a liquid-metal ion source. Therefore, in a case of performing observation, it is possible to perform observation at high resolution, and in a case of performing processing, it is possible to perform fine and extremely accurate processing.

Meanwhile, in a case where the crystal structure of the emitter 52 is broken during use, rearrangement of atoms configuring the emitter 52 is performed. Specifically, the heating unit 53 is operated, thereby locally heating the tip of the emitter 52 (for example, at 800° C. to 900 ° C. for several minutes). At this time, heating is performed based on a heating sequence stored in a memory 7b. As a result, the atoms configuring the tip of the emitter 52 are rearranged, whereby it is possible to restore the crystal structure of the tip of the emitter 52 to the original crystal structure shown in FIG. 6.

Subsequently, replacement of the emitter 52 will be described.

As shown in FIGS. 3 and 4, in a case of removing the emitter 52, first, the locking screw 69 is unscrewed, and the emitter 52 is pulled out from the supporting member 54. Subsequently, both end portions of the filament 66 are removed from the conductive pins 65, and the emitter 52 is removed from the filament 66.

Meanwhile, in a case of attaching a new emitter 52, first, both end portions of the filament 66 are connected to the lower end portions of the conductive pins 65, and an upper portion of the emitter 52 is connected to the central portion of the filament 66 by spot welding or the like. Thereafter, the upper portion (insertion portion 52c) of the emitter 52 is inserted into the supporting member 54. Then, the emitter 52 is fixed in the supporting member 54 by the locking screw 69.

Then, replacement of the emitter 52 ends.

As described above, in the present illustrative embodiment, the emitter 52 is connected to the supporting member 54 fixed to the base member 61.

Figure 8:
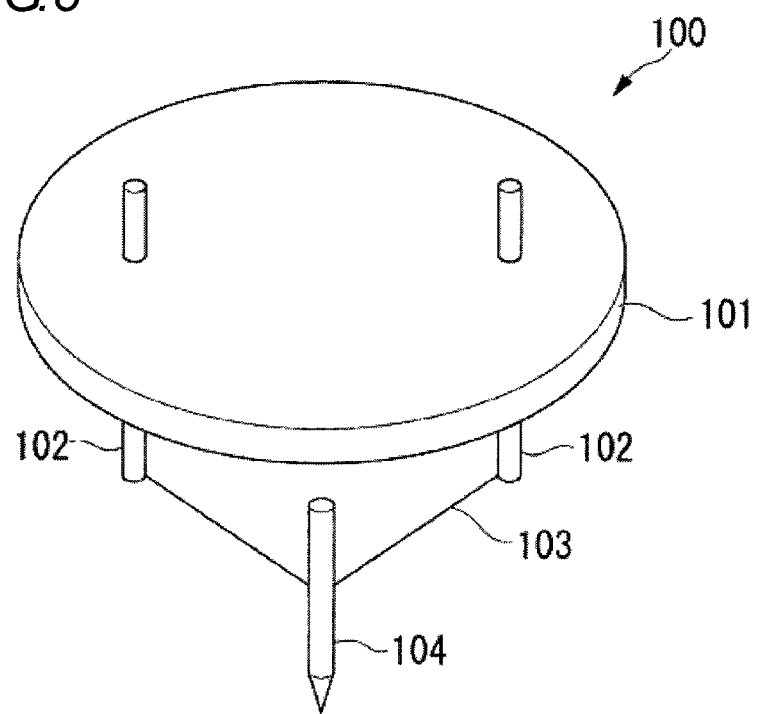
FIG. 8 is a perspective view of a related-art emitter structure.

According to this configuration, since the emitter 52 is connected not only to the filament 66 but also to the supporting member 54, it is possible to more stably hold the emitter 52 with respect to the base member 61, as compared to a configuration in which the emitter is hung and supported only by the filament 103 (see FIG. 8) as in the related-art configuration. In this case, it becomes easy to vertically hold the emitter 52 with respect to the base member 61, and it is possible to make it easy to align the optical axis of the focused ion beam (FIB) with a desired direction.

Also, unlike in the related-art configuration, since it is unnecessary to separately provide a gimbal mechanism or the like for adjusting the tilt or position of the optical axis of the focused ion beam (FIB), it is possible to reduce the number of components, simplify the system, and more accurately and stably hold the emitter 52 with respect to the base member 61.

Further, in the present illustrative embodiment, during cooling of the emitter 52, heat of the emitter 52 is radiated to the base member 61, the cold head 71, and so on through the supporting member 54. Therefore, as compared to a case where heat of the emitter is radiated only through the filament 103 (see FIG. 8) as in the related-art configuration, it is possible to improve the cooling efficiency of the emitter 52.

In this case, the supporting member 54 has thermal conductivity higher than that of the filament 66, and is formed thicker than the filament 66, heat of the emitter 52 is efficiently radiated to the supporting member 54. Therefore, it is possible to surely improve the cooling efficiency of the emitter 52.

Further, in the present illustrative embodiment, since the emitter 52 is inserted into the cylindrical supporting member 54 and is fixed in that state, it is possible to more stably hold the emitter 52.

Furthermore, according to the gas field ion source 21 and the focused ion beam system 1 of the present illustrative embodiment, since the emitter structure 22 is provided, it is possible to stably generate the gas ions G3, and it is possible to continuously radiate the focused ion beam (FIB) with a small beam diameter and high luminance in a desired direction.

While the present invention has been shown and described with reference to certain illustrative embodiments thereof, it will be understood by those skilled in the art that various changes in form and details may be made therein without departing from the spirit and scope of the invention as defined by the appended claims.

For example, in the above-described illustrative embodiment, the crystal orientation of the emitter 52 is set to a (111) plane. However, the crystal orientation of the emitter may be set to a (100) plane or a (110) plane.

Also, in the above-described illustrative embodiment, the base material 52a of the emitter 52 is formed of tungsten (W). However, the base material 52a may be formed of molybdenum (Mo). Also, the noble metal 52b to coat the surface of the base material 52a is iridium (Ir). However, as the noble metal 20b, any other material such as palladium (Pd), rhodium (Rh), rhenium (Re), or osmium (Os) may be used. Especially, since the surface of the emitter 52 is coated by the noble metal 52b which is one of materials as described above, the emitter 52 has chemical resistance. Also, in terms of chemical resistance, it is preferable to use iridium (Ir).

Also, in the above-described illustrative embodiment, the emitter 52 having a crystal structure in which one atom (an atom Al) is arranged at the tip edge is described as an example. However, the present invention is not necessarily limited to the case where the emitter has the tip end with one atom. The emitter may have any other crystal structure such as a crystal structure in which three atoms are arranged at the tip edge as long as the same crystal structure can be restored by a restoring process (atom rearrangement). Also, the crystal structure depends on the material of the crystal, and the restoring process.

Also, in the above-described illustrative embodiment, as the gas G2 which is supplied into the ion generating chamber 51, helium (He) gas is supplied. However, the present invention is not limited thereto. For example, argon (Ar) gas, neon (Ne) gas, krypton (Kr) gas, xenon (Xe) gas, or the like may be used. Further, besides noble gases, a gas such as hydrogen ($H_2$) or oxygen ($O_2$) can be used. In this case, according to use of the focused ion beam (FIB), the kind of gas G2 may be switched in midstream or two or more gases G2 may be mixed and then supplied.

Also, in the above-described illustrative embodiment, in a case of rearranging the atoms configuring the emitter 52, the tip of the emitter 52 is locally heated. In this case, in addition to heating, electrons may be emitted in a strong electric field, resulting in rearrangement. Also, in addition to heating, in a strong electric field, electrons may be emitted while helium (He) gas, neon (Ne) gas, or argon (Ar) gas may be introduced, resulting in rearrangement. Alternatively, in addition to heating, oxygen ($O_2$) or nitrogen ($N_2$) may be introduced, resulting in rearrangement. Even in these cases, it is possible to achieve the same effects.

Also, in the above-described illustrative embodiment, a configuration in which the conductive pins 65 and the supporting member 54 are fixed to the base member 61 by spot welding or the like is described. However, the present invention is not limited thereto. The conductive pins 65 and the supporting member 54 can be fixed by a variety of methods such as screwing. For example, a supporting member 54 having a male screw portion formed at the peripheral surface may be inserted into the through-hole 61a of the base member 61, and nut members may be screwed to the supporting member 54 from both sides of the base member 61 in the vertical direction. In this way, it is possible to fix the supporting member 54 with respect to the base member 61, with the base member 61 interposed between the two nut members. Also, by the same method, it is possible to fix the conductive pins 65 to the base member 61.

Also, in the above-described illustrative embodiment, a case of forming the supporting member 54 of copper is described. However, the present invention is not limited thereto. If a material has thermal conductivity higher than that of the filament 66 or is thicker larger than the filament 66, it is possible to appropriately modify the design.

Also, in the above-described illustrative embodiment, a configuration in which the emitter 52 is held in the cylindrical supporting member 54 is described. However, the present invention is not limited thereto. The method of connecting the supporting member 54 and the emitter 52 can be appropriately modified.

What is claimed is:

1. An emitter structure comprising:
    a pair of conductive pins which are fixed to a base member;
    a filament which is connected between the pair of conductive pins; and
    an emitter which is connected to the filament and has a sharp tip;
    wherein a supporting member is fixed to and extends through the base member, and the emitter is connected to the supporting member.

2. The emitter structure according to claim 1, wherein the supporting member is formed of a material having thermal conductivity higher than that of the filament.

3. The emitter structure according to claim 1, wherein the supporting member is formed thicker than the filament.

4. The emitter structure according to claim 1,
    wherein the supporting member is formed in a cylindrical shape, and
    wherein the emitter is fixed while a base end portion of the emitter is inserted into the supporting member.

5. A gas ion source comprising:
    the emitter structure according to claim 1;
    a gas source which is configured to supply a gas to a vicinity of the emitter;
    a cooling unit configured to cool the emitter;
    an extraction electrode which is disposed apart from the tip of the emitter; and
    an extraction power source unit which is configured to apply an extraction voltage between the emitter and the extraction electrode to ionize the gas into gas ions at the tip of the emitter and extract the gas ions toward the extraction electrode.

6. A focused ion beam system comprising:
    the gas ion source according to claim 5; and
    a beam optical system which is configured to convert the extracted gas ions into a focused ion beam and irradiate a sample with the focused ion beam.

7. In a gas field ion source, an emitter stucture comprising:
    a base member to which are fixed two conductive pins;
    a filament having two end portions connected to respective ones of the two conductive pins;
    a supporting member connected to the base member, the supporting member having a thermal conductivity higher than that of the filament; and
    an emitter having a sharp tip, the emitter being supported by the supporting member and connected to the filament.

8. The gas field ion source according to claim 7; wherein the supporting member, in the region between the base member and the emitter, has a diameter larger than that of the filament and the conductive pins.

9. The gas field ion source according to claim 7; wherein the supporting member has throughout its length a diameter larger than that of the filament and the conductive pins.

10. The gas field ion source according to claim 9; wherein the supporting member has a cylindrical shape.

11. The gas field ion source according to claim 10; wherein the emitter is removably inserted into an opening in the supporting member and detachably connected to the supporting, member.

12. The gas field ion source according to claim 7; wherein the emitter is removably inserted into an opening in the supporting member and detachably connected to the supporting member.

13. The gas field ion source according to claim 7; wherein the supporting member extends through the base member and has an upper portion that extends above the base member and a lower portion that extends below the base portion, the emitter being connected to the lower portion of the supporting member.

14. The gas field ion source according to claim 13; wherein the supporting member has a tubular shape.

15. The gas field ion source according to claim 14; wherein the tubular-shaped supporting member has a diameter throughout the lower portion thereof that is larger than the diameters of the filament and the conductive pins.

16. The gas field ion source according to claim 13; further including a surrounding member that extends downward from a peripheral edge of the base member and defining therewith an ion generating chamber, the lower portion of the base member and the emitter being situated within the ion generating chamber.

17. The gas field ion source according to claim 7; further including a surrounding member that extends downward from a peripheral edge of the base member and defining therewith an ion generating chamber, the lower portion of the base member and the emitter being situated within the ion generating chamber.

18. The gas field ion source according to claim 17; further comprising
    a gas source configured to supply a gas into the ion generating chamber;
    a cooling unit configured to cool the emitter,
    an extraction electrode disposed at a lower end portion of the ion generating chamber spaced from the tip of the emitter; and
    an extration electrode power source unit which is configured to apply an extraction voltage between the emitter and the extraction electrode to ionize the gas into gas ions at the tip of the emitter and extract the gas ions toward the extraction electrode.

19. A focused ion beam system, comprising:
    the gas field ion source according to claim 18; and
    a beam optical system configured to convert the extracted gas ions into a focused ion beam and irradiate a sample with the focused ion beam.

* * * * *